United States Patent [19]
Walker

[11] 3,978,421
[45] Aug. 31, 1976

[54] ELECTRICAL MUSICAL INSTRUMENT AMPLIFIER HAVING IMPROVED TREMOLO CIRCUIT, IMPROVED REVERBERATION CONTROL, AND POWER REDUCTION CIRCUIT FOR DISTORTION MODE OPERATION

[75] Inventor: Thomas A. Walker, Tustin, Calif.
[73] Assignee: Music Man, Inc., Anaheim, Calif.
[22] Filed: Nov. 27, 1974
[21] Appl. No.: 527,754

[52] U.S. Cl................................ 330/124 R; 84/1.25; 330/130
[51] Int. Cl.² ........................................... H03F 3/68
[58] Field of Search.................. 330/69, 124 R, 130, 330/127; 328/267

[56] References Cited
UNITED STATES PATENTS

| | | | |
|---|---|---|---|
| 2,713,620 | 7/1955 | Tilley............................... | 330/130 X |
| 2,785,336 | 3/1957 | Konkel et al. .................... | 328/267 X |
| 3,473,081 | 10/1969 | Yoshikawa....................... | 328/267 X |
| 3,614,571 | 10/1971 | Koch................................ | 330/127 X |
| 3,863,165 | 1/1975 | Egawa et al. ..................... | 330/69 X |

Primary Examiner—James B. Mullins
Attorney, Agent, or Firm—Fraser and Bogucki

[57] ABSTRACT

An electrical musical instrument amplifier is disclosed in which a signal which has been provided by an instrument to a second one of two different preamplifiers for amplification therein is passed to one of the inputs of a summing amplifier together with the output of the first preamplifier, the output of the summing amplifier being coupled through a tube driven power amplifier to a loudspeaker system. The amplified signal from the second preamplifier is applied to a second input of the summing amplifier via a circuit arranged as a voltage divider and having a variable resistance provided by a field effect transistor driven by an oscillator. The modulation provided by the field effect transistor and associated oscillator can be adjusted to provide total phase reversal as well as amplitude modulation when combined with the signal at the output of the second preamplifier, to provide a tremolo or vibrato effect. Improved reverberation control is provided by a control common to the volume controls of both a delayed reverberation signal from the second preamplifier and the combined signal which results when the instrument signal from the second preamplifier is combined with the delayed reverberation signal. The power amplifier can be operated in a distortion mode to achieve desirable harmonics without overloading the voice coils in an attached speaker system through use of a power supply which applies reduced voltages to the power amplifier whenever the gain of the power amplifier is adjusted to a high setting while at the same time regulating the voltage applied to the first and second preamplifiers to keep such voltage constant.

12 Claims, 26 Drawing Figures

ELECTRICAL MUSICAL INSTRUMENT AMPLIFIER HAVING IMPROVED TREMOLO CIRCUIT, IMPROVED REVERBERATION CONTROL, AND POWER REDUCTION CIRCUIT FOR DISTORTION MODE OPERATION

BACKGROUND OF THE INVENTION

1. Field of the Invention

The present invention relates to electrical musical instrument amplifiers, and more particularly to amplifiers of the type providing a tremolo effect, reverberation, and distortion mode operation when desired.

2. History of the Prior Art

Amplifiers designed for use with electrical musical instruments such as electric guitars are sometimes provided with the capability of producing certain effects in addition to the amplification of signals from the instrument to provide for driving a loudspeaker system. One desirable effect is that of tremolo or vibrato in which the music is made to sound as though it were coming from different directions by use of a technique similar to the Doppler Effect. Another common effect is that of reverberation in which the sound creates the impression of being reflected or echoing. Also, it is common practice in the case of electric guitars to increase the gain of the amplifier to produce operation in a distortion mode, thereby adding certain desired harmonics to the sound which are not otherwise present.

The tremolo effect is presently obtained by using various circuit techniques including the use of a variable resistor or the use of a light dependent resistor modulated by a light and driven by an oscillator with the light dependent resistor being used to vary an amplifier. Such approaches have been accompanied by numerous problems, including problems in the circuitry itself and in the amount of circuitry required as well as in the quality of the tremolo effect which is achieved.

Reverberation is typically accomplished by feeding the signal from the instrument after it has been at least partially amplified in a preamplifier stage to a reverberation circuit where it is amplified and applied to a reverberation spring assembly. The spring assembly places transducers on opposite ends of a spring so as to delay the signal prior to sending it back to the preamplifier via a volume control for combination with the partially amplified signal in the preamplifier. In certain situations it may be desirable to adjust the volume control associated with the reverberation circuit to provide a very large reverberation signal. However where the output of the amplifier is set at a relatively high volume, and particularly where the reverberation spring assembly is located relatively close to the loudspeaker system which is typically the case, the reverberation spring undergoes vibration with a very bad effect on the resulting sound.

Operation in a distortion mode is usually accomplished by increasing the gain at the preamplifier stage to cause overdriving of the various stages thereof. However the most pleasing type of distortion usually results only when the gain at the power amplifier stage as well as at the preamplifier stage is turned up to a relatively high level. This enables the amplifier stages within the power amplifier to be overdriven, and the resulting sound in very satisfying, particularly where there are large power tubes in the power amplifier. However, as the gain of the power amplifier stages increases the resulting output waveform which begins to approach that of a squarewave provides an increasing duty cycle with the practical result that the power applied to the loudspeaker system is considerably greater. This may result in immediate destruction of the speaker system, but in any event results in a greatly shortened life for the speaker system in most cases. Consequently either an expensive speaker system must be periodically sacrificed to provide for a desirable distortion mode of operation, or the gain settings at the power amplifier stages must be left at low settings, thereby providing some distortion from the preamplifier but at the same time something less than the amount or quality of the distortion of this type usually desired.

Accordingly it would be desirable to provide an electrical musical instrument amplifier capable of providing an improved tremolo effect with a minimum addition of circuitry to the amplifier.

It would also be desirable to provide an electrical musical instrument amplifier in which the amount of reverberation and the total volume are automatically balanced so as to prevent inadvertent vibration of the reverberation spring and the resulting undesirable effects.

It would furthermore be desirable to provide an electrical musical instrument amplifier in which both the power amplifier stages and the preamplifier stages can be driven in a distortion mode whenever desired without damaging or greatly shortening the life of the speaker system.

BRIEF DESCRIPTION OF THE INVENTION

Electrical musical instrument amplifiers in accordance with the invention provide an improved tremolo effect with a minimum addition of circuitry by using a summing amplifier which combines output signals from first and second preamplifiers to algebraically combine the output of the second preamplifier after it has been modulated by a voltage divider and associated oscillator with the unaltered output of the second preamplifier. The voltage divider is formed by a resistor defining a fixed resistance and a field effect transistor defining a variable resistance which is varied in cyclic fashion as the output of the oscillator is applied to the gate of the field effect transistor. An adjustable resistor in circuit with the field effect transistor adjusts the nominal amplitude of the modulated signal from the output of the second preamplifier as it is applied to the non-inverting input of the summing amplifier in the form of an operational amplifier for combination with the unaltered output from the second preamplifier applied to the inverting input of the operational amplifier. By proper adjustment of the amplitude of the modulated signal, the combined signal at the output of the operational amplifier which is fed to a power amplifier is not only amplitude modulated but is reversed in phase twice during each cycle of the modulation oscillator so as to provide a modulation frequency effectively twice that of the oscillator frequency. The amplitude of the modulated signal may be adjusted downwardly to a point where full modulation occurs, but not phase reversal. Further decreases in the amplitude of the modulated signal provide varying degrees of amplitude modulation less than full modulation for the combined signal at the output of the operational amplifier.

In accordance with the invention the amount of reverberation and total output volume are balanced by use of a common control for the reverberation volume and the combined volume at the output of the second preamplifier. The signal from an electrical musical instrument as amplified by at least one of the stages of the second preamplifier is fed through a reverberation amplifier where it is delayed by the reverberation spring system and amplitude-adjusted by a volume control prior to being returned to the second preamplifier where it is combined with the unaltered instrument signal within the second preamplifier and thereafter passed through a volume control to the summing amplifier at the input of the power amplifier. The reverberation volume control and the volume control at the output of the second preamplifier are operated by a common control device which varies the two different volume controls in inverse relationship so that the reverberation is decreased as the volume of the combined signal is increased, and vice versa.

In accordance with the invention distortion mode operation within the power amplifier is made possible without harm to or destruction of the speaker system by use of a power supply system for the power amplifier which is capable of assuming different levels depending on the gain adjustment of the power amplifier. For normal operation a switch coupled between a power source and the primary winding of a power transformer within the power supply is set so as to apply the voltage from the power source to only a part of the primary winding, thereby providing full voltage in the secondary which is thereafter used in the power amplifier, resulting in an output power which does not harm or damage the speaker system. When the gain of the power amplifier is to be increased to a level sufficient to provide a distortion mode of operation, the switch is altered so as to apply the voltage of the power source across the entire primary winding, resulting in a reduced voltage at the secondary winding. This reduced voltage results in the application of reduced voltages to the power amplifier. Consequently the output power of the power amplifier is high enough to produce the desired driving of the speaker system while at the same time low enough to prevent damage or destruction to the speaker system. Diodes within the power supply regulate the operating voltages applied to the first and second preamplifiers at fixed levels independently of the voltages applied to the power amplifier.

BRIEF DESCRIPTION OF THE DRAWINGS

The foregoing and other objects features and advantages of the invention will be apparent from the following more particular description of a preferred embodiment of the invention as illustrated in the accompanying drawings, in which.

DETAILED DESCRIPTION

Figure 1:
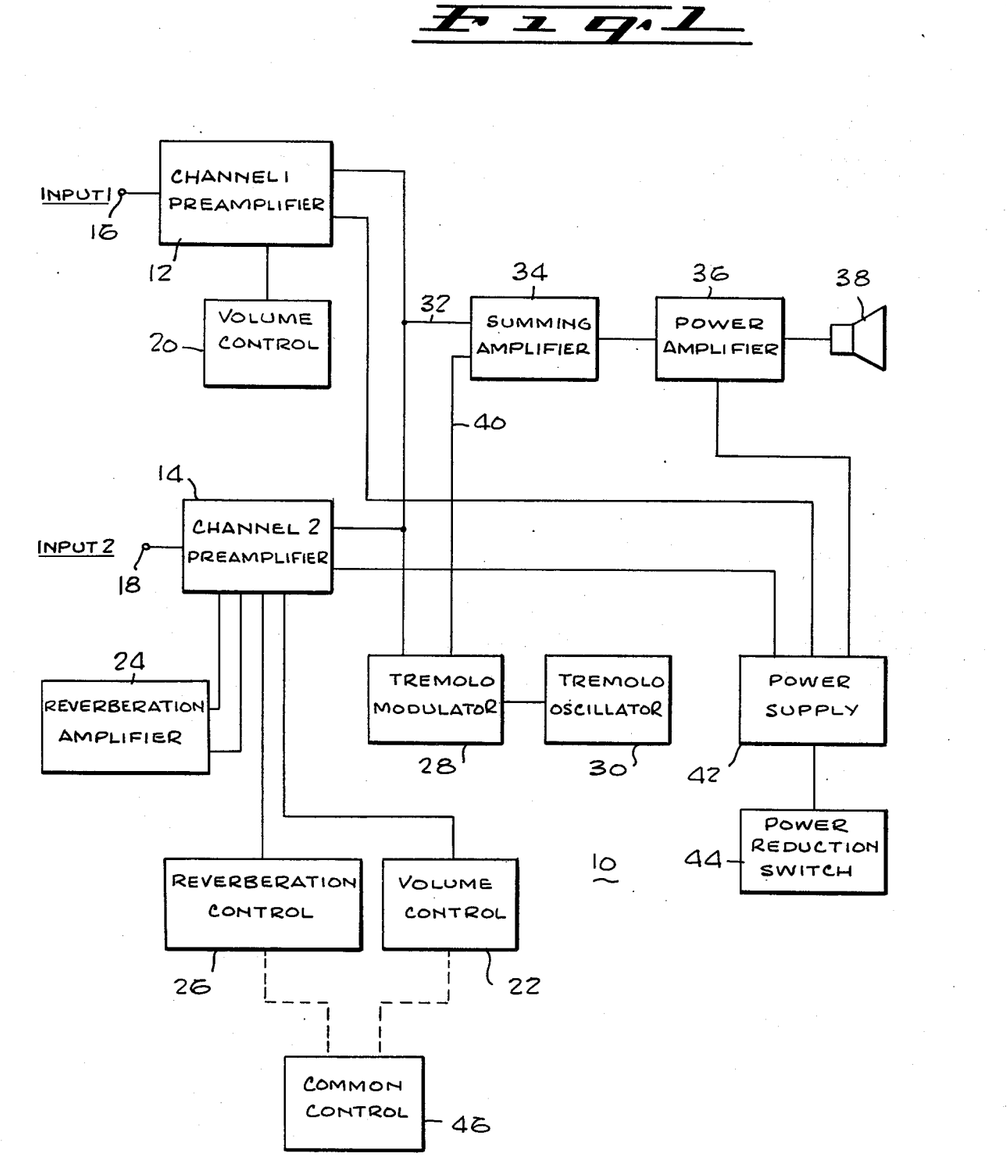
FIG. 1 is a block diagram of an electrical musical instrument amplifier in accordance with the invention.

FIG. 1 depicts an electrical musical instrument amplifier 10 in accordance with the invention. The amplifier 10 has two channels defined by a pair of preamplifiers 12 and 14, the inputs 16 and 18 of which define the inputs for the two different channels. Most musical instrument amplifiers include two separate preamplifier channels so that more than one instrument may be played through the amplifier at a given time. Separate channels provide for individual tone and volume controls so that the response of each instrument may be properly equalized without affecting the other. In addition, a musician often performs on more than one type of instrument and multiple channels allow each instrument to be set up in advance so that the performer may switch from one instrument to the other without interruption or delay as would be caused if he had to disconnect one instrument and connect another and then readjust tone and volume controls for proper balance.

In the case of the amplifier 10, the first or channel 1 preamplifier 12 which includes a volume control 20 provides a backup channel for the amplifier 10. The second or channel 2 preamplifier 14 which has a volume control 22 provides the main channel of the amplifier 10. In addition to the volume and tone controls which the first channel has, the second channel has special effects including reverberation provided by a reverberation amplifier 24 and a reverberation control 26 and tremolo or vibrato provided by a tremolo modulator 28 and a tremolo oscillator 30.

The outputs of the preamplifiers 12 and 14 are applied to a first input 32 of a summing amplifier 34 which feeds a power amplifier 36 coupled to drive a loudspeaker system 38 illustrated as a single speaker for ease of illustration in FIG. 1. A second input 40 of the summing amplifier 34 is coupled to receive the output of the preamplifier 14 via the tremolo modulator 28. A power supply 42 which includes a power reduction switch 44 is coupled to supply power to the preamplifiers 12 and 14 and the power amplifier 36.

The output of the preamplifier 12 which is applied to the input 32 of the summing amplifier 34 is amplified by the summing amplifier 34 and thereafter amplified by the power amplifier 36 before being applied to the speaker system 38. The output of the preamplifier 14 which is also applied to the summing amplifier 34 via the input 32 may be modified by the signal from the tremolo modulator 28 applied to the input 40 to provide a tremolo effect in accordance with the invention. The summing amplifier 34 algebraically combines the output signal from the preamplifier 14 applied to the input 32 with the same output signal as modified by the tremolo modulator 28 and applied to the input 40. The tremolo modulator 28 and associated oscillator 30 may be adjusted to provide up to 100 per cent modulation of the output signal from the preamplifier 14 as well as complete phase reversal, in accordance with the invention. The two signals as algebraically combined by the summing amplifier 34 are amplified by the amplifier 34 prior to being passed to the power amplifier 36 for amplification to drive the speaker system 38. The tremolo modulator 28 includes a portion of variable resistance which varies in accordance with the signal from the oscillator 30 to vary the amplitude of the output signal from the preamplifier 14 applied to the input 40 of the summing amplifier 34. The resulting algebraic combination of the signal at the input 40 and the output signal of the preamplifier 14 applied to the input 32 provides amplitude modulation and, where desired, phase reversal in the resulting combined signal.

The summing amplifier 34 or equivalent circuitry is usually required in two channel amplifiers to provide for combining of the signals from the two different channels. Accordingly tremolo circuits in accordance with the invention which utilize the summing amplifier 34 provide for circuit simplicity and efficiency by making double use of the summing amplifier 34. The additional circuitry required by the tremolo modulator 28 and the tremolo oscillator 30 constitutes a relatively minor addition of circuitry to the amplifier 10, as will be appreciated from the detailed example described hereafter. In particular, tremolo circuits in accordance with the invention have the unique capability of providing complete phase reversal of the output signal from the preamplifier 14 as well as amplitude modulation to provide for a unique and superior tremolo effect.

The musical instrument signal applied to the input 18 of the second channel is amplified by a first stage of the preamplifier 14 and is thereafter applied to a second amplification stage of the preamplifier 14 both directly and via the reverberation amplifier 24 and the control 26. As described in detail hereafter the reverberation amplifier 24 uses conventional techniques including a reverberation spring assembly to delay the signal at the output of the first amplification stage of the preamplifier 14. The reverberation control 26 adjusts the volume of this delayed signal prior to combination with the original signal at the output of the first amplifier stage. The combined signal is then amplified by the second amplification stage of the preamplifier 14 and the amplitude thereof is adjusted by the volume control 22 prior to being applied to the output of the preamplifier 14.

In accordance with the invention the reverberation control 26 and the volume control 22 are simultaneously adjusted by a common control 46 to prevent undesired effects which result when both the reverberation volume and the total volume at the output of the preamplifier 14 are adjusted to high. It has been found that with the volume control 22 set to provide a relatively high volume at the output of the preamplifier 14, the reverberation has an unpleasing effect, particularly if the reverberation volume control 26 is set very high. This is due among other things to the tendency of the spring in the reverberation spring assembly within the amplifier 24 to undergo vibration, particularly if the spring is located relatively close to the speaker system 38 as is typically the case when the amplifier 10 and the speaker system 38 are mounted within the same cabinetry. It has been found that this unpleasing effect is prevented if the reverberation control 26 and the volume control 22 are adjusted in an inverse relationship as provided by the common control 46. As described hereafter the common control 46 decreases the reverberation control 26 as the volume control 22 is increased, and vice versa. Accordingly whenever the reverberation effect is desired the common control 46 provides for the maximum amount of reverberation for a given output volume of the preamplifier 14.

When the amplifier 10 is to be operated in a distortion mode the gain of the preamplifiers 12 and 14 is increased so as to cause the various amplification stages thereof to operate in nonlinear fashion to produce output signals of generally square waveform in response to sinusoidal input signals. For best effects the gain of the power amplifier 36 is also increased. However this normally results in greatly increased power being applied to the speaker system 38, resulting in damage and destruction of the speaker system 38. In accordance with the invention a power reduction switch 44 is employed whenever the gains of the preamplifiers 12 and 14 and the power amplifier 36 are adjusted for distortion mode operation. The power reduction switch 44 provides for a reduction in the voltages applied to the power amplifier 36 by the power supply 42. Consequently the output power provided by the power amplifier 36 to the speaker system 38 while still sufficiently large to drive the speaker system 38 in a desired manner is kept at a low enough level to prevent damage or destruction of the speaker system 38. At the same time the voltage applied to power the preamplifiers 12 and 14 by the power supply 42 is regulated to prevent reduction in the voltage gain of the preamplifiers 12 and 14. When it is desired to return to a non-distortion mode of operation the power reduction switch 44 is used to restore the voltages supplied to the power amplifier 36 to their full value.

Figure 2:
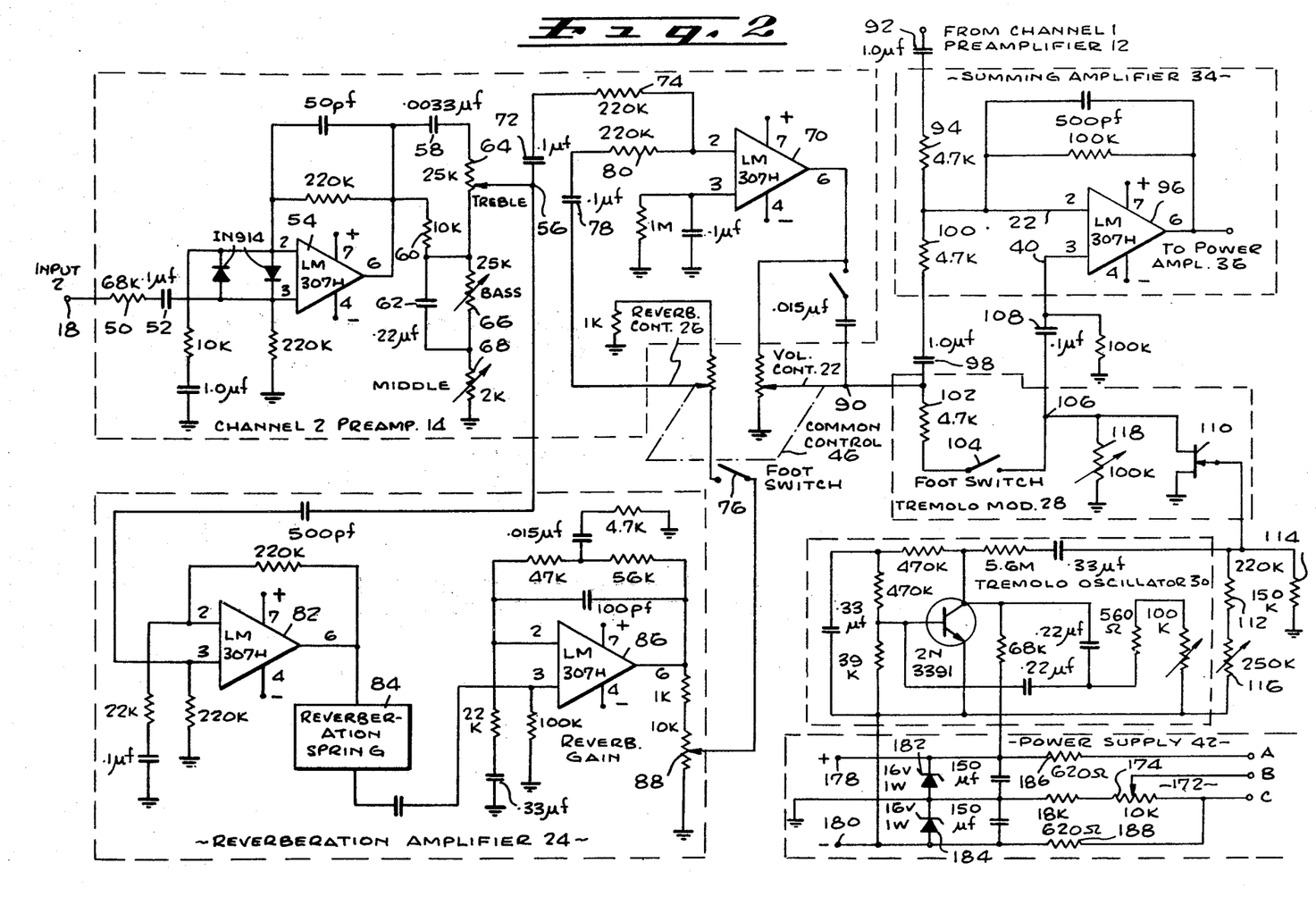
FIG. 2 is a schematic diagram of a portion of the amplifier of FIG. 1.
Figure 3:
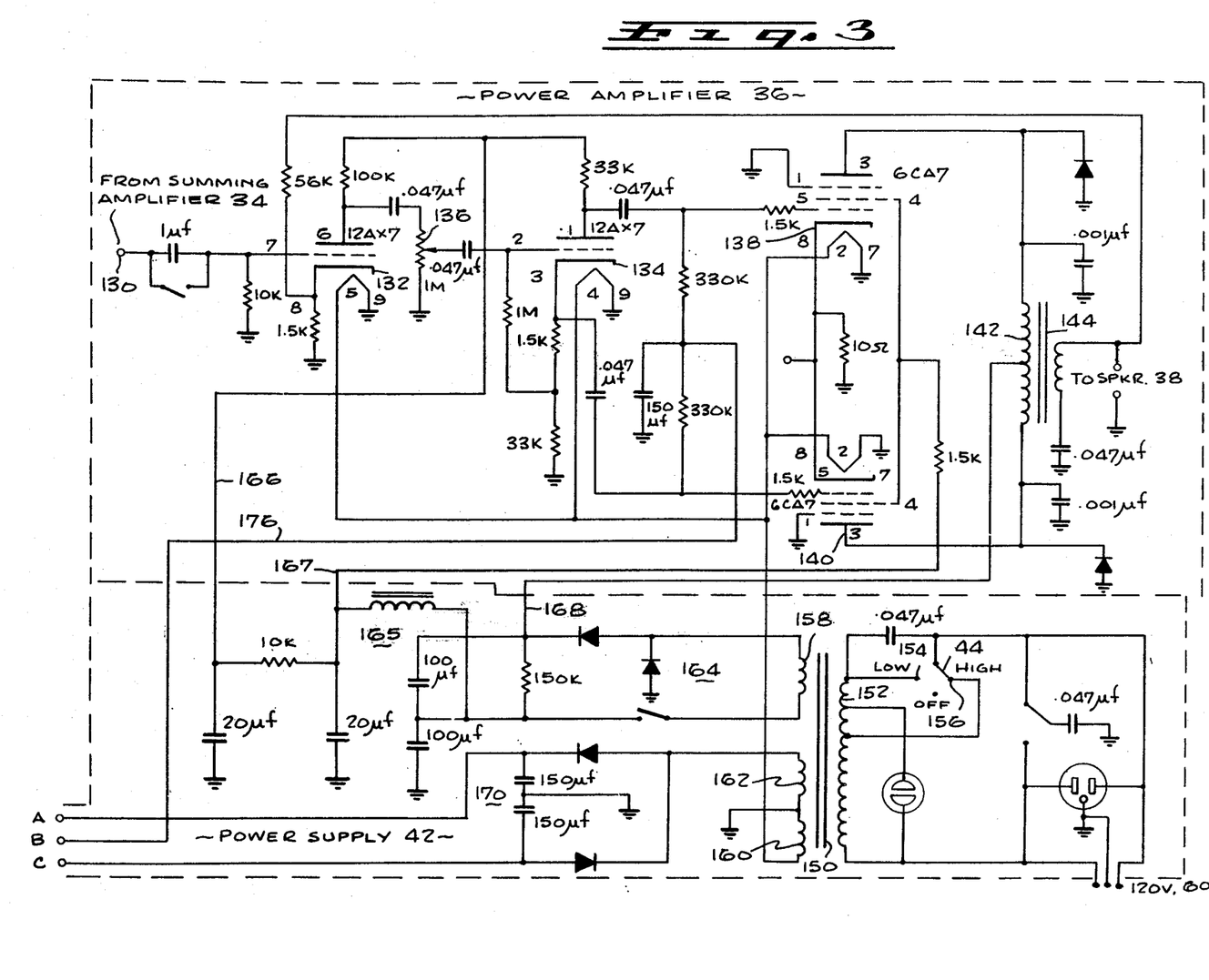
FIG. 3 is a schematic diagram of another portion of the amplifier of FIG. 1.

FIGS. 2 and 3 together comprise a schematic diagram of a circuit providing an example of the amplifier 10 of FIG. 1. As seen in FIG. 2 the input terminal 18 of the channel 2 preamplifier 14 is coupled through an isolating resistor 50 and a blocking capacitor 52 to the non-inverting input of an operational amplifier 54 defining the first amplification stage of the preamplifier 14. The output of the operational amplifier 54 is applied to a terminal 56 via a tone control system which includes a capacitor 58, a resistor 60, a capacitor 62, a potentiometer 64, and two variable resistors 66 and 68. The tone control system is arranged such that adjustment of the potentiometer 64 provides variation in the trouble range, adjustment of the resistor 66 provides variation in the base range and adjustment of the resistor 68 provides variation in the middle frequency range.

The signal at the terminal 56 is applied to the inverting input of an operational amplifier 70 both directly via a path including a blocking capacitor 72 and a resistor 74 and through a path including the reverberation amplifier 24, a foot switch 76, the reverberation control 26, a blocking capacitor 78 and a resistor 80. The signal from the terminal 56 applied to the reverberation amplifier 24 is applied to the non-inverting input of an operational amplifier 82 which provides amplification to drive the transducer at the input end of a reverberation spring assembly 84. A transducer at the output of the spring assembly 84 is coupled to an operational amplifier 86 for amplification prior to being passed to the foot switch 76 via a potentiometer 88 which provides the gain control for the reverberation amplifier 24. The foot switch 76 enables the musician to control by foot when the reverberation effect is to be provided. The output of the foot switch 76 is coupled through the potentiometer defining the reverberation control 26 to the common input of the operational amplifier 70 defining the second amplification stage of the preamplifier 14 via the blocking capacitor 78 and the resistor 80.

The output of the operational amplifier 70 is provided to an output terminal 90 of the preamplifier 14 via the potentiometer defining the volume control 22. The reverberation control 26 and the volume control 22 are coupled to the common control 46 in such a way that they are varied in inverse relationship. In the present example the common control 46, the reverberation control 26 and the volume control 22 comprise a dual control switch in which the two potentiometers defining the reverberation control 26 and the volume control 22 are mounted in tandem. Accordingly, as the control 46 is varied so as to adjust the volume control 22 for increased volume at the output terminal 90, the reverberation control 26 is adjusted to decrease the volume of the reverberation signal applied to the common input of the operational amplifier 70, and vice versa.

The schematic circuitry for the channel 1 preamplifier 12 is identical to the circuitry for the preamplifier 14 except that the terminal 56 is coupled exclusively to the non-inverting input of the operational amplifier 70 via a blocking capacitor to continue to amplify the signal without any reverberation effect. The resulting output signal from the preamplifier 12 is applied via a capacitor 92 and a resistor 94 to the common input 22 comprising the inverting input of an operational amplifier 96 within the summing amplifier 34. The output terminal 90 of the preamplifier 14 is coupled through a capacitor 98 and a resistor 100 to the input 22.

The output terminal 90 of the preamplifier 14 is also coupled to the input 40 comprising the non-inverting input of the operational amplifier 96 via a resistor 102, a foot switch 104, a terminal 106 and a capacitor 108. The foot switch 104 provides for foot control of the tremolo effect by the musician. The resistor 102 comprising a part of the tremolo modulator 28 comprises a fixed resistance in a first circuit path coupled between the output terminal 90 of the preamplifier 14 and the terminal 106. The resistor 102 functions in combination with a field effect transistor 110, the source and drain terminals of which are coupled in a second circuit path between the terminal 106 and ground, to define a voltage divider. The output signal of the tremolo oscillator 30 is applied to the gate terminal of the field effect transistor 110 to vary the resistance between the source and drain terminals, thereby varying the division of the signal voltage at the terminal 106 between the second circuit path including the field effect transistor 110 and a third circuit path extending to the input 40 of the operational amplifier 96 and including the capacitor 108.

The tremolo oscillator 30 which is of conventional form provides a signal of generally sinusoidal waveform to the gate terminal of the field effect transistor 110 via a pair of fixed resistors 112 and 114 and a variable resistor 116 at the output thereof. The resistors 112, 114 and 116 provide negative gate bias to the field effect transistor 110, with the variable resistor 116 providing for adjustment of the bias to an optimum point on the transfer curve of the field effect transistor 110. The sinusoidal waveform from the oscillator 30 varies the resistance of the field effect transistor 110 so as to vary the amplitude of the signal from the output terminal 90 of the preamplifier 14 as it is applied to the input 40 of the operational amplifier 96. A variable resistor 118 coupled in parallel with the field effect transistor 110 defines a tremolo intensity control which is used to vary the effect of the field effect transistor 110 and thereby adjust the volume of the modulation signal applied to the input 40 of the operational amplifier 96.

Figure 4:
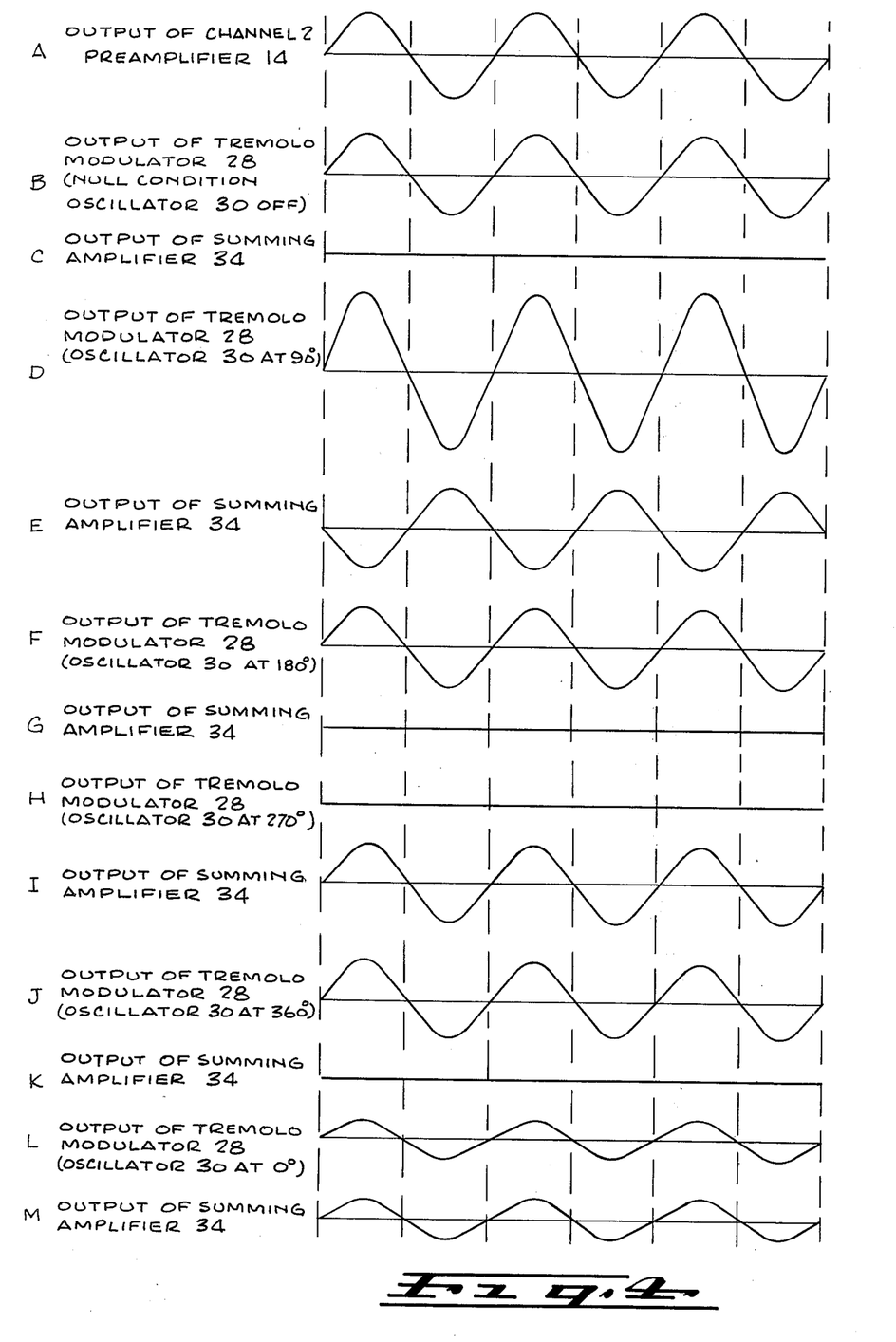
FIGS. 4A–4W comprise waveforms useful in explaining the operation of the amplifier of FIG. 1.

The operation of the tremolo modulator 28, the oscillator 30 and the summing amplifier 34 may best be understood by referring to the waveforms of FIG. 4. FIG. 4A depicts the output of the preamplifier 14 at the terminal 90 as a generally sinusoidal waveform. This same waveform appears at the input 32 of the operational amplifier 96 within the summing amplifier 34. With the oscillator 30 turned off the same signal is applied via the resistor 102, the foot switch 104, the terminal 106 and the capacitor 108 to the input 40 of the operational amplifier 96 as seen in FIG. 4B. The variable resistor 116 within the tremolo oscillator 30 is adjusted so that the amplitude of the signal at the input 40 is equal to the amplitude of the signal at the input 32 of the operational amplifier 96. Since the inputs 32 and 40 are inverting and non-inverting respectively, the two signals cancel and the resulting combined signal at the output of the summing amplifier 34 is of zero value as seen in FIG. 4C.

When the tremolo oscillator 30 is first turned on and is at 0° the output of the modulator 28 remains the same and cancels the signal from the preamplifier 14 in the operational amplifier 96 so that the output of the summing amplifier 34 continues to be of zero value as shown in FIG. 4C. As the oscillator 30 proceeds from 0° to 90° the resistance provided by the field effect transistor 110 increases so as to increase the signal from the modulator 28 to a maximum value at 90° as shown in FIG. 4D. This signal combines with the output of the preamplifier 14 to provide a combined signal at the output of the summing amplifier 34 of sinusoidal waveform as seen in FIG. 4E.

As the tremolo oscillator 30 proceeds from 90° to 180°, the output of the modulator 28 decreases to the point where the waveform thereof is identical to the waveform at the 0° condition for the oscillator as shown in FIG. 4F. This again results in a combined signal at the output of the summing amplifier 34 of zero value as shown in FIG. 4G. As the oscillator 30 proceeds from 180° to 270°, the output of the modulator 28 decreases to zero value as shown in FIG. 4H. As a result the combined signal at the output of the summing amplifier 34 is the same as the signal from the output of the preamplifier 14 as shown in FIG. 4I.

As the oscillator 30 proceeds from 270° to 360° the signal at the output of the modulator 28 increases so as to equal the output signal from the preamplifier 14 as shown in FIG. 4J. This again results in the combined output from the summing amplifier 34 assuming zero value as shown in FIG. 4K.

It will be seen that with the nominal value of the modulation signal from the modulator 28 adjusted so as to equal the signal at the output of the preamplifier 14 with the oscillator off, such signal proceeds to increase to its maximum value, then decrease to its minimum or zero value and then increase to its nominal value as the oscillator 30 proceeds through a cycle of its output waveform. Consequently the combined signal at the output of the summing amplifier 34 proceeds from zero to a negative sinusoid, then to zero, then to a positive sinusoid and then back to zero as the oscillator 30 proceeds through a cycle from 0° to 360°. Therefore the combined signal at the output of the summing amplifier 34 undergoes two reversals in phase for each cycle of the oscillator 30 and may be said to have a frequency effectively twice that of the modulation frequency defined by the oscillator 30.

The behavior of the combined signal at the output of the summing amplifier 34 during each full cycle of the oscillator 30 is depicted in FIG. 4T with the arrow showing the extent of modulation and phase change of the signal. During each cycle of the oscillator 30 the combined signal shown in FIG. 4T goes from zero value to a negative sinusoid shown by the dashed waveform, then back to zero value as the oscillator reaches the 180° point, then to the positive sinusoid shown by the solid line waveform as the oscillator proceeds to 270°, then back to zero value as the oscillator 30 reaches the 360° point so as to begin the start of a new cycle. This condition of operation in which the combined signal at the output of the summing amplifier 34 reverses in phase twice for each cycle of the oscillator 30 is the full modulation condition with phase reversal. It provides a much improved tremolo effect because of the complete phase reversal instead of mere amplitude modulation of the signal from the preamplifier 14.

If the variable resistor 118 within the tremolo modulator 28 is adjusted so as to reduce the amplitude of the signal at the output of the modulator 28, a point is reached at which the maximum value of the signal applied to the input 40 of the operational amplifier 96 equals the value of the signal from the preamplifier 14. This condition is illustrated in FIGS. 4L–4S and 4U. When the oscillator 30 is at 0°, the output of the modulator 28 is at half of its maximum value as seen in FIG. 4L. This signal combines in the operational amplifier 96 to reduce the signal from the preamplifier 14 to half of its maximum value as seen in FIG. 4M. As the oscillator 30 proceeds from 0° to 90°, the signal at the output of the modulator 28 increases to its maximum value as shown in FIG. 4N. This signal cancels the output signal from the preamplifier 14 so that the combined signal at the output of the summing amplifier 34 is of zero value as shown in FIG. 4O.

As the oscillator 30 proceeds from 90° to 180°, the output signal from the modulator 28 reduces to half value as shown in FIG. 4P, allowing the combined signal at the output of the summing amplifier 34 to increase to half its maximum value as shown in FIG. 4Q. Cycling of the oscillator 30 from 180° to 270° reduces the signal at the output of the modulator 24 to zero value as shown in FIG. 4R, allowing the combined signal at the output of the summing amplifier 34 to increase to its maximum value as shown in FIG. 4S. As the oscillator 30 continues to cycle from 270° to 360° the output of the modulator 28 increases to half of its maximum value as shown in FIG. 4L, providing the combined signal at the output of the summing amplifier 34 with half of its maximum value as shown in FIG. 4M.

The behavior of the combined output signal at the summing amplifier 34 for full modulation as just described is shown in FIG. 4U with the change in the amplitude thereof being illustrated by the arrow. As seen in FIG. 4U the combined output signal varies between zero and a positive sinusoid. The difference between the full modulation of FIG. 4U and the full modulation of FIG. 4T is that in the example of FIG. 4U the combined output signal is modulated so as to be reduced to zero but does not reverse in phase as in the example of FIG. 4T.

FIG. 4V shows the case where the variable resistor 118 in the tremolo modulator 28 is adjusted so that the signal at the output of the modulator 28 varies between zero and a value half the value of the signal at the output of the preamplifier 14. For each cycle of the oscillator 30, the signal at the output of the modulator 28 increases from quarter value to half value, then decreases through quarter value to zero value, then increases to quarter value. The resulting effect on the output signal from the preamplifier 14 is to cause the combined signal at the output of the summing amplifier 34 to decrease from full value to half value and then increase back to full value during each cycle of the oscillator as shown in FIG. 4W. This condition of reduced modulation which provides a relatively small tremolo effect does not involve either phase reversal as in the full modulation of FIG. 4T or complete amplitude modulation as in the case of FIG. 4U.

Referring to FIG. 3 the combined signal at the output of the summing amplifier 34 is applied to an input terminal 130 of the power amplifier 36 from which it is applied to the grid of a triode vacuum tube 132 for amplification. The plate of the triode 132 is coupled to the grid of a second triode tube 134 via a potentiometer 136 forming the master gain control for the power amplifier 36. The triode 134 operates as a phase splitter to alternately feed the grids of a pair of pentode vacuum tubes 138 and 140 coupled to drive the primary winding 142 of an output transformer 144 in push-pull fashion. The secondary of the output transformer 144 is coupled to the speaker system 38.

As previously noted distortion mode operation is commonly achieved in prior art systems by turning up the gain in the preamplifiers to a relatively high level. The gain in the power amplifier is also desirably turned up to a relatively high level, but at the risk of damaging or destroying the speaker system. Where the power amplifier is powered by a fixed power supply, an increase in the gain thereof greatly increases the duty cycle resulting in a substantial increase in the output power to the speaker system. For example, if the amplifier delivers 130 watts of rms power during normal operation, distortion mode operation may result in 220 watts of squarewave power being delivered to the speaker system.

In accordance with the invention the power amplifier 36 is powered by a power supply 42 the voltage of which is variable so as to be reduced to a lower value to provide lower voltages to the power amplifier 36 when the gain of the power amplifier 36 is raised to the distortion mode level. At the same time the voltage supply to the preamplifiers 12 and 14 is regulated to prevent a decrease in the voltage gain within the preamplifiers. The power supply 42 is shown in FIGS. 2 and 3.

Referring to FIG. 3 the power supply 42 includes a transformer 150 having a primary winding 152 coupled across a 120 volt, 60hz power source. The power reduction switch 44 is arranged to be coupled to either a low terminal 154 thereof or a high terminal 156 thereof. When the switch 44 is coupled to the low terminal 154 the power source voltage of 120 volts is applied across the entire primary winding 152. On the other hand when the switch 44 is coupled to the high terminal 156 the supply voltage of 120 volts is coupled across the lower two-thirds of the primary winding 152.

The transformer 150 has three different secondary windings 158, 160 and 162. The secondary winding 158 is coupled through a rectifier circuit 164 and a filter circuit 165 to provide plate voltage to the triode tube 132 and 134 via a lead 166, to provide screen voltage to the pentode tubes 138 and 140 via a lead 167 and to provide plate voltage to the pentode tubes 138 and 140 via a lead 168.

During normal operation when the switch 44 is coupled to the low terminal 154 to apply 120 volts to the entire primary winding 152, a given voltage is induced in the secondary winding 158 to provide nominal plate voltage to the triode tubes 132 and 134 and nominal screen and plate voltages to the pentode tubes 138 and 140. When distortion mode operation is desired the gain of the preamplifiers 12, 14 is turned up in addition to adjusting the master gain control potentiometer 136 to increase the gain of the power amplifier 36. At the same time the switch 144 is positioned at the high terminal 156, applying 120 volts across the lower two-thirds of the primary winding 152. This results in a lower voltage being induced in the secondary winding 158, with a consequent reduction in the plate voltage to the triode tubes 132 and 134 and the screen and plate voltages to the pentode tubes 138 and 140.

The secondary winding 160 provides voltage to the cathode heaters of the tubes 132, 134, 138 and 140. When the switch 44 is changed from the low terminal 154 to the high terminal 156 for distortion mode operation, the voltage induced in the secondary winding 160 is reduced so as to provide a reduced voltage to the heaters of the tubes in the power amplifier 36.

The secondary winding 162 is coupled through a rectifier circuit 170 to a preamplifier supply circuit 172 shown in FIG. 2. The preamplifier supply circuit 172 includes a potentiometer 174 for providing grid bias voltage to the pentode tubes 138 and 140 and the power amplifier 36 via a lead 176 shown in FIG. 3. The preamplifier supply circuit 172 also provides supply voltages to the preamplifiers 12 and 14 via positive and negative terminals 178 and 180 respectively. A pair of Zener diodes 182 and 184 are coupled to provide a fixed voltage of 16 volts to the terminals 178 and 180. During normal operation when the switch 44 is coupled to the low terminal 154, a selected voltage is provided to the secondary winding 162 to provide a desired grid bias voltage to the pentode tubes 138 and 140 in addition to 16 volts supply voltage to the preamplifiers 12 and 14 via the terminals 178 and 180. When the switch 44 is positioned at the high terminal 156 for distortion mode operation, the voltage induced in the secondary winding 162 is reduced, thereby reducing the grid bias voltage to the pentode tubes 138 and 140. However the Zener diodes 182 and 184 which are protected by series resistors 186 and 188 respectively continue to provide 16 volts to the preamplifiers. In this manner the supply voltage to the preamplifiers 12 and 14 is regulated independently of the voltage at the primary winding 152 of the transformer 150.

A much simpler arrangement for reducing the power to the speaker system 38 could be provided by simply reducing the voltage at the secondary of the output transformer 144 within the power amplifier 36. However in accordance with the invention the operating parameters of the various tubes within the power amplifier are themselves changed, providing for a reduced output power while at the same time providing for superior distortion mode operation. When the power reduction switch 44 is positioned at the high terminal 156, the plate voltage to the triode tubes 132 and 134 is reduced together with the plate, grid and screen voltages to the pentode tubes 138 and 140. At the same time the cathode heater voltage provided by the secondary winding 160 is reduced. The reduction in the cathode heater voltage plays an important role in the proper operation of the various tubes within the power amplifier 36 in the distortion mode. The heater voltage is reduced to a point where cathode emission of the various tubes occurs in an on-off manner. This facilitates operation of the tubes in the desired squarewave fashion rather than in the much more linear fashion present during normal operation.

As previously noted the amplifier 10 can deliver up to 130 watts of rms power during normal operation. This would result in 220 watts of squarewave power at maximum distortion being provided to the speaker system 38 during distortion mode operation. Reducing the operating voltage in accordance with the invention limits the amplifier to 65 watts of squarewave output power which is small enough to prevent damage to or destruction of the speaker system 38 while at the same time being large enough to obtain full cone excursion of the speaker system.

While the invention has been particularly shown and described with reference to a preferred embodiment thereof, it will be understood by those skilled in the art that various changes in form and details may be made therein without departing from the spirit and scope of the invention.

What is claimed is:

1. An amplifier for an electrical musical instrument comprising:
   a summing circuit having inverting and non-inverting inputs;
   a first preamplifier capable of receiving a signal from an electrical musical instrument and having an output coupled to one of the inputs of the summing circuit;
   a second preamplifier capable of receiving a signal from an electrical musical instrument and having an output coupled to said one of the inputs of the summing circuit;
   a first circuit path coupling the output of the second preamplifier to the other one of the inputs of the summing circuit, the first circuit path including a fixed resistance;
   a second circuit path coupled to the first circuit path between the fixed resistance and said other one of the inputs of the summing circuit, the second circuit path including a variable resistance; and
   an oscillator coupled to vary the resistance of the variable resistance in the second circuit path.

2. The invention defined in claim 1, wherein the variable resistance comprises a field effect transistor having source and drain terminals coupled in the second circuit and a gate terminal coupled to the oscillator.

3. The invention defined in claim 2, further including an adjustable resistance coupled in parallel with the field effect transistor.

4. An amplifier for electrical musical instruments comprising:
   amplifier means for amplifying a signal from an electrical musical instrument to provide a loudspeaker drive signal, the amplifier means comprising a plurality of controllably conductive power amplifying devices and having a variable gain;
   control means for varying the gain of the amplifier means; and
   power supply means coupled to said amplifier means for supplying a plurality of signals to the controllably conductive power amplifying devices to establish operating parameters for the controllably conductive power amplifying devices, said power supply means being adjustable between a first setting which provides the loudspeaker drive signal with normal power when the gain of the amplifier means is in a first range and a second setting which reduces the values of the plurality of signals to change the operating parameters of the controllably conductive power amplifying devices and thereby provides the loudspeaker drive signal with reduced power when the gain of the amplifier means is in a second range higher than the first range.

5. The invention defined in claim 4, wherein the plurality of signals comprises a set of voltages.

6. The invention defined in claim 5, wherein the power supply means includes a transformer having primary winding means coupled to a source of electrical power via switching means and secondary winding means coupled to provide the set of voltages to the controllably conductive power amplifying devices, the switching means being operative to couple a first portion of the primary winding means across the source of electrical power to provide the first setting and to couple a second portion of the primary winding means larger than and including the first portion across the source of electrical power to provide the second setting.

7. The invention defined in claim 5, wherein the controllably conductive power amplifying devices comprise vacuum tubes having a plurality of electrodes coupled to receive the set of voltages from the power supply means.

8. The invention defined in claim 7, wherein at least some of the tubes have a cathode heater coupled to one of said plurality of electrodes.

9. An amplifier for electrical musical instruments comprising:
preamplifier means coupled to receive and amplify a signal from an electrical musical instrument;
power amplifier means for further amplifying the signal after amplification by the preamplifier means, the power amplifier means being variable between a normal gain range and a high gain range in which the signal from an electrical musical instrument is distorted in a predetermined manner; and
power supply means coupled to power the preamplifier means and the power amplifier means, the power supply means being adjustable to provide either of two different sets of voltages to the power amplifier means, one of the two different sets of voltages establishing normal operating parameters in the power amplifier means when the power amplifier means is in the normal gain range and the other one of the two different sets of voltages establishing different operating parameters in the power amplifier means to reduce the output power when the power amplifier means is in the high gain range.

10. The invention defined in claim 9, wherein the power supply means includes means for providing a constant voltage to the preamplifier means independent of the sets of voltages being provided to the power amplifier means.

11. The invention defined in claim 9, wherein the power supply means includes a source of electrical power and a transformer having primary winding means coupled to the source of electrical power via a switch and secondary winding means coupled to the power amplifier means, the switch being movable between a first position to couple part but not all of the primary winding means across the source of electrical power to provide a first one of the two different sets of voltages to the power amplifier means and a second position to couple all of the primary winding means across the source of electrical power to provide a second one of the two different sets of voltages less than the first one to the power amplifier means.

12. The invention defined in claim 11, wherein the secondary winding means is coupled to the preamplifier means and the power supply means includes diodes coupled to regulate the voltage from the secondary winding means to the preamplifier means independent of the position of the switch.

* * * * *